(12) United States Patent
Shelnut et al.

(10) Patent No.: US 6,440,642 B1
(45) Date of Patent: Aug. 27, 2002

(54) DIELECTRIC COMPOSITION

(75) Inventors: James G. Shelnut, Northboro; Wade Sonnenberg, Upton, both of MA (US); James L. Aubry, Kingston, NH (US); Jennifer Patricia Canlas, North Kingstown, RI (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/397,301

(22) Filed: Sep. 15, 1999

(51) Int. Cl.⁷ ............................................... G03F 7/004
(52) U.S. Cl. ................ 430/315; 430/270.1; 430/280.1; 428/411.1; 428/901
(58) Field of Search ............................ 430/315, 270.1, 430/280.1; 428/411.1, 901

(56) References Cited

U.S. PATENT DOCUMENTS

| | | | |
|---|---|---|---|
| 4,092,443 A | 5/1978 | Green | 427/53 |
| 4,180,598 A | 12/1979 | Emmons | 427/44 |
| 4,510,008 A | 4/1985 | Hoshi et al. | 156/245 |
| 4,557,860 A | 12/1985 | Disalvo et al. | 252/512 |
| 4,619,837 A | 10/1986 | Brown | 427/44 |
| 5,108,825 A * | 4/1992 | Wojnarowski et al. | 428/209 |
| 5,262,280 A | 11/1993 | Knudsen et al. | 430/312 |
| 5,352,310 A | 10/1994 | Natter | 156/155 |
| 5,763,140 A * | 6/1998 | Kukanskis et al. | 430/315 |
| 5,910,394 A | 6/1999 | Shelnut | 430/280.1 |
| 5,993,945 A * | 11/1999 | Russell et al. | 428/209 |
| 6,187,380 B1 | 2/2001 | Hallman et al. | 427/261 |

FOREIGN PATENT DOCUMENTS

| | | |
|---|---|---|
| EP | 0 262 891 A | 4/1988 |
| EP | 0 933 681 A | 8/1989 |
| EP | 0 735 071 | 10/1996 |
| WO | WO 98/23683 A | 6/1998 |
| WO | WO 99/13477 A | 3/1999 |

OTHER PUBLICATIONS

Database WPI, Section Ch, Week 199416, Derwent Publication Ltd., London, GB; Class A12, AN 1994–131667, XP002159612 & JP 06 079738 A (Yokohama Rubber Co Ltd), Mar. 22, 1994 *abstract*.

Database WPI, Section Ch, Week 199502, Derwent Publications Ltd., London, GB; Class A21, AN 1995–012489, XP002159613 & KR 9 401 072 B (Korea Chem Co. Ltd.), Feb. 12, 1994, *abstract*.

Database WPI, Section Ch, Week 199850, Derwent Publications Ltd., London, GB; Class A21, AN 1998–589846, XP002159614 & JP 10 265648 A (Matsushita Electric Works Ltd), Oct. 6, 1998, abstract.

* cited by examiner

*Primary Examiner*—Mark F. Huff
*Assistant Examiner*—Nicole Barreca
(74) *Attorney, Agent, or Firm*—S. Matthew Cairns

(57) ABSTRACT

Low VOC, dielectric compositions suitable for use in circuit board manufacture are disclosed. Also disclosed are methods of making circuit boards using the low VOC, dielectric compositions.

15 Claims, No Drawings

DIELECTRIC COMPOSITION

BACKGROUND OF THE INVENTION

This invention relates generally to the field of dielectric compositions. In particular, this invention relates to dielectric compositions having low volatile organic compound content.

A present trend in the printed wiring board industry is toward high density interconnected circuitry. Such circuitry has an increased number of circuit layers in a board with a decreased width of formed lines and spaces. Typically, a circuit board is manufactured by first constructing all circuits separately and laminating these layers together. Drilling and metallization of the drilled holes is then performed to electrically connect the layers. Recently, a new method of manufacturing multilayer circuit boards has been developed to address increased densification. Such new method sequentially builds circuit layers on a substrate. Substrates used in conventional multilayer printed circuit boards typically include glass cloth reinforced copper-clad plastic substrates that range in thickness from 4–8 mils for the insulative plastic alone.

In a typical process for sequential building of circuit layers, a definable dielectric material is coated onto an appropriate substrate either as a solution in a solvent, which includes a drying step, or as a pre-dried film resident on polyester. The definable coating is then lithographically processed by exposure and development to provide lines, spaces and vias as required by the circuit design. Alternatively, such structures may be defined by laser drilling which uncovers an area onto which an electrical connection can be made from the upper, just coated, layer. The definable coating is then adhesion promoted and plated, followed by a print and etch operation that defines the next circuit layers. The above process is then repeated until the desired number of layers and interconnections are achieved.

In general, the definable dielectric materials are dissolved in a solvent. For example, U.S. Pat. No. 5,262,280, herein incorporated by reference, describes a process of sequentially building a printed circuit board using a dielectric material in a solvent. Once a coating of the dielectric material is applied to the substrate, it must be dried prior to lithographic processing. In this drying step, a large amount of volatile organic material is generated, e.g., from evaporation of the solvent. In some areas of the world the emissions of volatile organic compounds ("VOC") are regulated or prohibited. Thus, the volatilized solvent from the drying step in the dielectric coating process must be contained, which greatly adds to the cost and inconvenience of the process.

Another method of application is from a dry film construction. In this method, a solvent-borne dielectric coating is first coated onto a carrier sheet, then the solvent is removed by heating.

Photodefinable dielectrics must contain components that make the coating developable, that is, components which make the dielectrics either more or less soluble in the developer. Thus, photodefined areas are created during exposure of the photodefinable coatings to the developer, upon which copper can be later deposited. The developable components used in the dielectric coatings are typically highly polar compounds, which helps their solubility. Unfortunately, such developable components increase the dielectric constant of the dielectric coatings, which must be as low as possible for circuitry applications.

Low surface tack is an important property of known dielectric coatings as such dielectric coating will come into direct contact with artwork during the photodefining process. The surface tack of the dielectric coating needs to be low enough such that the artwork can slide over the surface of the dielectric coating for ease of registration with the dielectric coated substrate. Such low surface tack concerns limit the available low dielectric material formulations.

In the course of applying the dielectric, either from solvent or from dry film construction, the problem of planarization occurs since the coatings are applied over three-dimensional structures. When solvent-borne dielectric material is used, the liquid will planarize, however, during evaporation of the solvent, the thickness of the material shrinks to a percentage of the formulation. The amount of shrinkage will be the same whether over a raised circuit or in the valley between. As the solvent evaporates, the remaining dielectric will shrink to conform to the different heights, resulting in a three-dimensional surface. This is also true of dry film construction which has a uniform film thickness. When applied to a three-dimensional structure, the film will conform to the uneven surface.

Thus, there is a need in the art for dielectric coatings that have low volatile organic compound content, low dielectric constants, avoid the issue of surface tack and have improved planarization.

SUMMARY OF THE INVENTION

The present invention provides such dielectric compositions. The advantages of the present invention are that the amount of volatile organic components are greatly reduced, post exposure bake is avoided, development of the dielectric compositions is avoided, planarization is improved and surface tack issues are avoided.

In a first aspect, the present invention provides a composition including: a) from 1 to 99% by weight of at least one low dielectric constant, crosslinkable material; b) from 1 to 99% by weight of at least one reactive diluent; and c) optionally one or more additives; wherein the composition is substantially free of organic solvent.

In a second aspect, the present invention provides a composition including: a) from 20 to 80% by weight of at least one low dielectric constant, crosslinkable material; b) from 10 to 80% by weight of at least one crosslinking agent; c) from 0.1 to 25% by weight of at least one catalyst including acid generators, photoacid generators, thermal base generators, photobase generators, or mixtures thereof; d) from 5 to 60% by weight of a reactive diluent; and e) optionally one or more additives; wherein the composition is substantially free of organic solvent.

In a third aspect, the present invention provides a process for manufacturing circuit boards including the steps of applying a dielectric composition to a substrate; thermally curing the dielectric composition; providing one or more or lines, spaces or vias in the dielectric composition; promoting adhesion; and plating the dielectric layer with a conductive metal; wherein the dielectric composition includes a) from 1 to 99% by weight of at least one low dielectric constant, crosslinkable material; b) from 1 to 99% by weight of at least one reactive diluent; and c) optionally one or more additives; wherein the composition is substantially free of organic solvent.

In a fourth aspect, the present invention provides a process for manufacturing circuit boards including the steps of applying a dielectric composition to a substrate; thermally curing the dielectric composition; providing one or more or lines, spaces or vias in the dielectric composition; promoting adhesion; and plating the dielectric layer with a conductive metal; wherein the dielectric composition includes a) from 20 to 80% by weight of at least one low dielectric constant, crosslinkable material; b) from 10 to 80% by weight of at least one crosslinking agent; c) from 0.1 to 25% by weight of at least one catalyst including thermal acid generators, photoacid generators, thermal base generators, photobase generators, or mixtures thereof; d) from 5 to 60% by weight of a reactive diluent; and e) optionally one or more additives; wherein the composition is substantially free of organic solvent.

In a fifth aspect, the present invention provides a substrate coated with a dielectric composition as described above.

In a sixth aspect, the present invention provides a process for providing a dielectric coating on a substrate including the steps of preparing a melt of a dielectric polymer, and applying the melt to the substrate.

In a seventh aspect, the present invention provides a process for preparing a substrate having a dielectric coating including the steps of applying a dielectric composition as described above to form a coating on the substrate and curing the coating.

DETAILED DESCRIPTION OF THE INVENTION

As used throughout the specification, the following terms shall have the following meanings, unless the context clearly indicates otherwise.

The terms "printed wiring board" and "printed circuit board" are used interchangeably through the specification. The terms "polymer" and "polymeric" include dimers, trimers, oligomers, and the like. "Polymer" refers to both homopolymers and copolymers. The term "polymer" includes linear polymers, block copolymers and graft copolymers. "Crosslinking agents" and "crosslinkers" are used interchangeably throughout the specification. "(Meth) acrylic" refers to both acrylic and methacrylic. Likewise, "(meth)acrylate" refers to both acrylate and methacrylate and "(meth)acrylamide" refers to both acrylamide and methacrylamide. The term "alkyl" includes linear, branched and cyclic alkyl.

All ratios and amounts are by weight, unless otherwise noted. All numerical ranges are inclusive, unless otherwise noted. The following abbreviations are used throughout the specification: pph=parts per hundred; F=Fahrenheit; C=Centigrade; cps=centipoise per second; and asf=amps per square foot.

The dielectric compositions of the present invention include at least one low dielectric constant, crosslinkable material and at least one reactive diluent. The dielectric compositions of the present invention may optionally include one or more of crosslinking agent(s), catalyst(s) and additive(s). Preferably, the dielectric compositions of the present invention include at least one low dielectric constant, crosslinkable material, at least one crosslinking agent, at least one catalyst, at least one reactive diluent, and optionally one or more additives. Any low dielectric constant material that is thermally curable and reacts with the reactive diluent during the thermal curing step is suitable for use in the present invention. By low dielectric constant material is meant a material having a dielectric constant below 4.0, and preferably below 3.0. By thermally curable is meant a material that cures in the range of 100° to 500° C., and preferably in the range of 100° to 300° C. The low dielectric constant material useful in the present invention may be monomeric or polymeric.

Typically, the low dielectric material is present in the compositions of the present invention in an amount in the range of 1 to 99% by weight, based on the total weight of the composition. It is preferred that the amount of the low dielectric material is in the range of 20 to 80% by weight, and more preferably in the range of 25 to 60%.

The low dielectric materials useful in the present invention are well known and generally commercially available. Suitable low dielectric materials are described in U.S. Pat. No. 5,262,280, herein incorporated by reference to the extent it discloses such materials. Suitable low dielectric constant, crosslinkable material includes, but is not limited to: polybutadiene, functionalized polybutadiene, polyphenyleneoxides, functionalized polyphenyleneoxides, polyimides, functionalized polyimides, polyfluorocarbons, functionalized polyfluorocarbons and mixtures thereof. By "functionalized" is meant that the low dielectric material is substituted with a group that can be crosslinked with another compound, such as a compound containing a vinyl group, an acrylate, or an epoxy group. It is preferred that the low dielectric constant, crosslinkable material includes epoxidized polybutadiene, such as oligomeric epoxidized rubber. It will be appreciated that combinations of dielectric material may be used successfully in the present invention. Thus, mixtures of monomers and polymers are contemplated by the present invention.

Reactive diluents useful in the present invention are any compounds that are miscible with all the components of the composition and do not adversely affect the function of the dielectric material. The reactive diluents may be used to adjust the viscosity of the coating for various applications. For example, such reactive diluents may be a low viscosity or viscosity reducing material. The reactive diluents have the advantage of functioning as solubilizing components for the compositions of the present invention but also cure as part of the final coating, thus avoiding the problem of volatile organic compounds. The reactive diluents useful in the present invention may also function as crosslinking agents.

Suitable reactive diluents useful in the present invention include, but are not limited to: (meth)acrylic acid monomers or polymers, alkyl (meth)acrylate monomers or polymers, (meth)acrylamide monomers and polymers, low molecular weight acetals, vinyl ethers, poly(vinyl ethers), polyimides, polyamides, polyetherimides, urethanes and epoxies. It is preferred that when a urethane is used as a reactive diluent, that it is used in combination with another reactive diluent. Preferred reactive diluents are (meth)acrylic acid monomers or polymers, alkyl (meth)acrylate monomers or polymers, (meth)acrylamide monomers and polymers and epoxies. Epoxies are more preferred as reactive diluents. By low molecular weight acetals are meant acetals having a molecular weight up to about 1500 Daltons.

Typically, the alkyl (meth)acrylates useful in the present invention are $(C_1-C_{24})$alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to:

2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl(meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl(meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed Alfol alcohols from Vista Chemical company, i.e., Alfol 1618 and Alfol 1620, Ziegler catalyzed various Neodol alcohols from Shell Chemical Company, i.e. Neodol 25L, and naturally derived alcohols such as Procter & Gamble's TA-1618 and CO-1270. Consequently, for the purposes of this invention, alkyl(meth)acrylate is intended to include not only the individual alkyl(meth)acrylate product named, but also to include mixtures of the alkyl(meth) acrylates with a predominant amount of the particular alkyl (meth)acrylate named.

The alkyl(meth)acrylate monomers useful in the present invention may be a single monomer or a mixture having different numbers of carbon atoms in the alkyl portion. Also, the (meth)acrylamide and alkyl(meth)acrylate monomers useful in the present invention may optionally be substituted. Suitable optionally substituted (meth)acrylamide and alkyl(meth)acrylate monomers include, but are not limited to: hydroxy ($C_2$–$C_6$)alkyl(meth)acrylates, dialkylamino ($C_2$–$C_6$)-alkyl (meth)acrylates, dialkylamino($C_2$–$C_6$)alkyl (meth)acrylamides.

Particularly useful substituted alkyl(meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1 methyl-2-hydroxyethyl acrylate, 2-hydroxybutyl methacrylate, 2-hydroxybutyl acrylate and mixtures thereof. The preferred hydroxyalkyl(meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

The epoxies useful as reactive diluents in the present invention include, but are not limited to: mono-, di- and tri-functional low viscosity epoxies, such as glycidyl butane ether and glycidyl butane diether.

More than one reactive diluent may be used successfully in the present invention. It will be appreciated by those skilled in the art that more than one reactive diluent may be needed to achieve a desired viscosity or solubility of the components of the composition or both. Typically, the reactive diluent is present in the compositions of the invention in a range of 1 to 99% by weight, based on the weight of the composition. It is preferred that the amount of the reactive diluent is 5 to 60% by weight, more preferably 15 to 55%, and even more preferably 20 to 50%.

Any aromatic or aliphatic crosslinking agent that reacts with the low dielectric constant material is suitable for use in the present invention. Such crosslinking agents will cure to form a polymerized network with the low dielectric material. Such crosslinking agents may be monomers or polymers. It will be appreciated by those skilled in the art that combinations of crosslinking agents may be used successfully in the present invention.

Suitable crosslinking agents useful in the present invention include, but are not limited to: phenolic resins, amine containing compounds, epoxy containing materials, compounds containing at least two vinyl ether groups, allyl substituted aromatic compounds, and combinations thereof. Preferred crosslinking agents include phenolic resins and amine containing compounds.

Suitable phenolic resins include, but are not limited to: phenol aldehyde condensates (known in the art as the novolak resins), homopolymers and copolymers of alkenyl phenols, partially hydrogenated novolak and poly (vinylphenol) resins, polymers containing phenolic units and nonaromatic cyclic alcohol units, and homopolymers and copolymers of N-hydroxyphenyl-maleimides. Of the phenolic resins suitable as crosslinkers for the compositions of the invention, the novolak resins are preferred.

Novolak resins are the thermoplastic condensation product of a phenol and an aldehyde. Examples of suitable phenols for condensation with an aldehyde, especially formaldehyde, for the formation of novolak resins, include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. Preferred novolak resins include phenol formaldehyde condensation products, cresol formaldehyde condensation products, and mixtures thereof.

In general, novolak resins are made following procedures known and disclosed in numerous publications such as DeForest, Photoresist Materials and Processes, McGraw-Hill Book Company, New York, Ch. 2, 1975; Moreau, Semiconductor Lithography Principles, Practices and Materials, Plenum Press, New York, Chs. 2 and 4, 1988; and Knop and Pilato, Phenolic Resins, Springer-Verlag, 1985, all said publications incorporated herein by reference to the extent they teach the preparation and use of novolaks and other phenolic resins.

Poly(vinylphenol) resins are thermoplastic materials that may be formed by block polymerization, emulsion polymerization or solution polymerization of corresponding monomers in the presence of a cationic catalyst. Vinylphenols used for production of poly(vinylphenol) resins may be prepared, for example, by hydrolysis of commercially available coumarins or substituted coumarins, followed by decarboxylation of the resulting hydroxy cinnamic acids. Useful vinyl phenols may also be prepared by dehydration of the corresponding hydroxy alkyl phenol or by decarboxylation of hydroxy cinnamic acids resulting from the reaction of substituted or non-substituted hydroxy benzaldehydes with malonic acid. Preferred poly(vinylphenol) resins prepared from such vinyl phenols have a molecular weight range of from about 2,000 to about 100,000 daltons. Procedures for the formation of poly(vinylphenol) resins also can be found in U.S. Pat. No. 4,439,516, incorporated herein by reference to the extent this patent teaches the preparation of these compounds. Many useful poly(vinylphenol) resins are commercially available from Maruzen Corporation, Tokyo, Japan.

The polymers containing phenolic units and nonaromatic cyclic alcohol units that are suitable for use in the present invention are analogous in structure to the novolak resins and poly(vinylphenol) resins. Such copolymer resins are described in European Patent Application No. 0 401 499, incorporated herein by reference to the extent this application teaches the preparation of these compounds.

The homopolymers and copolymers of N-hydroxyphenyl maleimides useful in the present invention include those disclosed in European Patent Application No. 0 255 989, incorporated herein by reference to the extent this application teaches the preparation of these compounds.

The amine containing compounds useful as crosslinking agents in the present invention include, but are not limited to: a melamine monomer or polymer, melamine-formaldehyde resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based crosslinkers. Particularly preferred are melamine formaldehyde resins, i.e., reaction products of melamine and formaldehyde. These resins are typically ethers such as trialkylol melamine and hexaalkylol melamine. The alkyl group may have from 1 to 8 or more carbon atoms but is preferably methyl. Depending upon the reaction conditions and the concentration of formaldehyde, the methyl ethers may react with each other to form more complex units.

The epoxy containing materials useful as crosslinkers in the present invention are any organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy crosslinking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials in the present invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Further examples of epoxides of this type are described in U.S. Pat. No. 3,018,262, herein incorporated herein by reference to the extent this patent teaches the preparation of such epoxides.

Suitable epoxides useful in the present invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis (3,4-epoxy-6-methylcyclohexylmethyl) adipate (e.g., ERL-4289 from Union Carbide Corp.), bis(2,3-epoxycydopentyl) ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL4269 from Union Carbide Corp.), flame retardant epoxy resins (e.g., DER-580, a brominated bisphenol type epoxy resin available from Dow Chemical Co.), 1,4-butanediol diglycidyl ether of phenolformaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or aralphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as crosslinkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substitutents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150 AR by Kennedy and Klim, Inc. (Little Silver, N.J.). Allyl phenyl compounds including allyl phenols are also described in U.S. Pat. No. 4,987,264, herein incorporated by reference to the extent this patent teaches the preparation of such compounds.

The compositions of the present invention may suitably comprise only a single type of crosslinker, e.g., only a phenolic resin crosslinker, or may contain two or more different crosslinkers. When a combination of crosslinkers is used in the present invention, it is preferred that the combination include a phenolic resin and an amine containing compound, and more preferably a cresol novolak resin and a melamine crosslinker. The concentration of crosslinking agents in the compositions of the present invention may vary within a relatively wide range. It will be appreciated by those skilled in the art that suitable crosslinker concentrations will vary with factors such as crosslinker reactivity and specific application of the composition. Typically, the crosslinking agent(s) is present in an amount in the range of 10 to 80% by weight, based on the total weight of the composition, preferably in the range of 15 to 70%, and more preferably in the range of 20 to 60%. It is preferred that a crosslinking agent is used in the compositions of the present invention.

The catalysts useful in the compositions of the present invention are any which catalyze the reaction of the low dielectric constant, crosslinkable material with the reactive diluent, and optionally any crosslinking agent. Such catalysts include, but are not limited to: thermal acid generators, photoacid generators, thermal base generators, photobase generators, and mixtures thereof. It will be appreciated by those skilled in the art that a mixture of two or more catalysts of one type, such as a mixture of two or more thermal acid generators, or a mixture of catalysts of different types, such as a thermal acid generator and photoacid generator, may be used advantageously in the present invention. Likewise, a mixture of a thermal base generator and a photobase generator may be used. It is preferred that the catalyst is a thermal acid generator.

The amount of catalyst useful in the present invention is any amount that catalyzes the reaction. The catalysts useful in the present invention are typically used in the range of 0.1 to 25% by weight, based on the weight of the composition.

It is preferred that the catalyst is present in an amount in the range of 0.5 to 15% by weight, and more preferably in the range of 1 to 12% by weight.

It will be appreciated that when a thermal acid or base generator is used, the composition may effectively be photoaccelerated, that is that light, such as UV, may be used to accelerate a reaction. For example, in a reaction containing a thermal acid generator, light may be used to start or accelerate the reaction, followed by heating. Such photoacceleration has the advantage that the amount of catalyst may be reduced.

The thermal acid generators useful in the present invention are any compounds which liberate acid upon heating, typically at a temperature in the range of about 25° to 220° C. Suitable thermal acid generators useful in the present invention include, but are not limited to: 2,4,4,6-tetrabromocyclohexadienone, organic sulfonic acids, such as dinonylnaphthalene disulfonic acid, dinonylnaphthalene sulfonic acid, dodecylbenzene sulfonic acid and p-toluene sulfonic acid, alkyl esters of organic sulfonic acids, such as benzoin tosylate, and 2-nitrobenzyl tosylate, benzylic halogenated aromatic compounds, mono- and di-alkyl acid phosphates, mono- and di-phenyl acid phosphates, alkylphenyl acid phosphates, and combinations thereof. Blocked thermal acid generators, that is, acid esters, are preferred, such as blocked dodecyl sulfonic acid esters and blocked phosphonic acid esters. Such thermal acid generators are well known in the art and are generally commercially available, such as NACURE brand blocked acid generators available from King Industries, Norwalk, Connecticut.

The thermal acid generators useful in the present invention may be a single compound or a combination of compounds. For example, two or more thermal acid generators may be used. Alternatively, the thermal acid generators may be a two-part system. Such two-part systems are particularly useful for room temperature, that is, 20° to 25° C., curing of the compositions of the present invention. In a two-part system, typically two or more compounds are mixed prior to combining with the other components of the composition. Such two-part systems have a relatively short pot-life, for example up to 4 hours, and thus are prepared just prior to use.

The thermal base generators useful in the present invention are any compounds which liberate base upon heating, typically at a temperature in the range of about 25° to 220° C. Suitable thermal base generators useful in the present invention include those described in Japanese Patent Application No. 5-158242, herein incorporated by reference.

The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, and sulfonated esters.

Particularly useful halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)1,3,5-triazine, 2-[2-(5-methylfuryl)ethylidene]-4,6-bis(trichloromethyl)- 1,3,5-triazine, 2-[2-(4-methylfuryl)ethylidene]-4,6-bis(trichloromethyl)-1,3,5-triazine, 2-[2-(3-methylfuryl)ethylidine]-4,6-bis-(trichloromethyl)-1,3,5- triazine, 2-[2-(4,5-dimethylfuryl)ethylidene]-4,6-bis (trichloromethyl)-1,3,5-triazine, 2-[2-(5-methoxyfuryl) ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis (trichloromethyl)-1,3,5-triazine, 2-[2-(4,5-dimethoxy-furyl) ethylidene]-4,6-bis(trichloromethyl)-1,3,5-triazine, 2-(2-(2-furfylethylidene)-4,6-bis(tribromomethyl)-1,3,5-triazine, 2-[2-(5-methylfuryl)ethylidene]-4,6-bis(tribromomethyl)-1, 3,5-triazine, 2-[2-(4-methylfuryl)-ethylidene]-4,6-bis (tribromomethyl)-1,3,5-triazine, 2-[2-(3-methylfuryl) ethylidene]-4,6-bis(tribromomethyl)-1,3,5-triazine, 2-[2-(4, 5-dimethoxfuryl)ethylidene]-4,6-bis(tribromomethyl)-1,3, 5-triazine, 2-[2-(5-methoxyfuryl)ethylidene]-4,6-bis (tribromomethyl)-1,3,5-triazine, 2-[2-(4-methoxyfuryl) ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis (tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis (trichloromethyl)-1,3,5-triazine, 2-phenyl-4,6-bis (tribromomethyl)-1,3,5-triazine, 2-(4-methoxyphenyl)-4,6-bis(trichloromethyl)-1,3,5-triazine, 2-(4-methoxyphenyl)-4, 6-bis(tribromomethyl)-1,3,5-triazine, 2-(2-(1-naphthyl)-4,6-bis(trichloromethyl)-1,3, 5-triazine, 2-(1-naphthyl)-4,6-bis (tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4, 6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2(3,4,5-trimethoxystyryl)-4,6-bis(trichloromethyl)-1,3,5-triazine, 2-(3-chloro-1-phenyl)-4,6-bis (trichloromethyl)-1,3,5-triazine, 2-(3-chlorophenyl)-4,6-bis (tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337–340 (1991), incorporated herein by reference.

The photobase generators useful in the present invention are any compounds which liberate base upon exposure to light, typically at a wavelength of about 320 to 420 nanometers, however other wavelengths may be suitable. Suitable photobase generators include, but are not limited to: benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl)dihydropyridines.

The additives which may optionally be present in the compositions of the invention include, but are not limited to: dyes, such as ORASOL BLUE, available from Ciba-Geigy, leveling agents, fillers, pigments, wetting agents, antifoam agents, adhesion promoters, thixotropic agents, fire retardants and the like. Such additives are well known in the art for coating compositions. It will be appreciated that more than one additive may be combined in the compositions of the present invention. For example, a wetting agent may be combined with a thixotropic agent. Suitable fillers and thixotropic agents include silica, fumed silica, talc and the like. Suitable wetting agents include silicon based agents, such as SILWET™, available from Dow. Such optional additives are commercially available from a variety of sources.

The dielectric compositions of the present invention are substantially free of organic solvent. By "substantially free" is meant that the compositions include up to 5% by weight, based on the total weight of the composition, of one or more organic solvents. Preferably, the amount of organic solvent is up to 3% by weight, and more preferably up to 2%. It is especially preferred that the dielectric compositions of the present invention are free of organic solvent.

Such organic solvents may be added to the composition for ease of formulation. Suitable organic solvents for use in the present invention include, but are not limited to: glycol ethers, such as ethylene glycol monomethyl ether, propylene glycol monomethyl ether, dipropylene glycol monomethyl ether; esters such as methyl cellosolve acetate, ethyl cellosolve acetate, propylene glycol monomethyl ether acetate, dipropylene glycol monomethyl ether acetate, and other solvents such as dibasic esters, propylene carbonate, γ-butyrolactone, ethyl lactate and alcohols, such as n-propanol, i-propanol, and the like.

A particularly useful dielectric composition of the present invention includes 20 to 30% by weight of epoxidized butadiene rubber, 10 to 15% by weight of a cres0 1 novolak crosslinker, 5 to 8% by weight of a melamine crosslinker, 1 to 5% by weight of fumed silica as a thixotropic agent, 1 to 5% by weight of blocked dodecyl sulfonic acid, 20 to 25% by weight of glycidyl butane ether, and 20 to 25% by weight of diglycidyl butane ether. It is further preferred that this composition is free of organic solvent.

The compositions of the present invention may be prepared by combining the components in any order. The components may be combined simultaneously or may be combined one at a time. For example, the low dielectric material may be first combined with the reactive diluent and crosslinking agent, followed by additional crosslinking agent and optional additives, and lastly combined with a thermal acid generator. It is preferred that all other components are combined prior to the addition of the thermal acid generator. It is further preferred that when a room temperature thermal acid generator is used, that it is added to the composition just before use.

The compositions of the present invention provide a circuitry dielectric layer having low VOC content, without the need for photocuring or development. Since there is no photocuring, surface tack is not an issue and since there is no development, high levels of polar developer material are avoided. Thus, the amount of dielectric material in the composition can be increased allowing the coating to be lower in dielectric constant than is achievable in known developable systems. Another advantage of the present invention is that dielectric layers are provided having greater than 90% planarization.

Using a method for forming a printed circuit board for purposes of exemplification, a composition of the invention may be applied to a substrate having a pattern of conductive material disposed thereon. The substrate may be a copper laminate substrate prepared by the methods described in Coombs, Printed Circuits Handbook, McGraw-Hill, (3 rd ed. 1988), incorporated herein by reference. Other suitable substrates include those prepared by laminating multilayer boards for the manufacture of printed circuit boards with vias (through-holes) and interconnections which may contain solder, as described in the above referenced Printed Circuits Handbook.

The compositions of the invention may be applied to the substrate using conventional techniques including screen coating (or screen printing), curtain coating, roller coating, slot coating, spin coating, flood coating, electrostatic spray, spray coating, dip coating and as a dry film. When the compositions of the present invention are spray coated, a heated spray gun may be used. As indicated above, the viscosity of the composition may be adjusted to meet the requirements for each method of application by adding additional reactive diluents for methods requiring low viscosity, such as dip coating, or optional additives, such as thickening agents and fillers, for methods requiring high viscosity, such as screen coating.

The coated substrate is then cured, either by thermal curing or photo-curing, dependeing on whether a thermal- or photo-generated catalyst is used. When the compositions are thermal cured, they may be cured at room temperature or in an oven. The particular curing temperature will depend upon the particular thermal acid generator chosen. Thus, the curing temperature must be sufficiently high for the thermal acid generator to liberate acid. Thermal curing may be conducted at temperatures ranging from about room temperature (i.e. 25° C.) to 180° C., preferably 100° to 140° C., for a period of time between about 30 and 240 minutes, preferably between about 45 and 90 minutes. The thermal cure hardens unreacted components, promotes flexibility of the coating layer and can enhance adhesion of the coating layer to the substrate. The coating layer also may be post cured using radio frequency ("RF") or microwave energy by methods well known in the coatings industry. When the catalyst is photo-generated, i.e., a photoacid or photobase is used as the catalyst, the coated substrate must be thermally cured, as described above.

Once cured, lines, spaces and vias are provided in the coating by means of laser ablation or drilling. Suitable lasers for use in such drilling include $CO_2$ and neodymium yttrium aluminum garnet ("Nd:YAG"). Such lasers are generally commercially available, such as from ESI, Coherent, Lumonics and Hitachi.

The coated substrate is then adhesion promoted by any known method, such as plasma etching, electrostatic discharge and swell and etch processes, preferably by swell and etch processes. In a typical swell and etch process, the coated substrate is first swelled with a solvent, such as CIRCUPOSIT 302, available from Shipley Co., Marlborough, Massachusetts, etched with permanganate, such as CIRCUPOSIT 3308, available from Shipley, Co., and neutralized, such as with CIRCUPOSIT 3314, available from Shipley Co., at room temperature for 2 minutes.

Finally, the coated substrate is plated with a conductive metal by any known method. Typically, the coated substrate is electrolessly plated with a metal, such as copper. In a typical electroless plating process, the adhesion promoted coated substrate is cfirst onditioned, such as with CIRCUPOSIT 3320, available from Shipley Co., at 45° C. for 5 minutes, then etched, such as with PREPOSIT 748, available from Shipley Co., then catalyzed, such as CATAPOSIT 44, available from Shipley, Co., at room temperature for 5 minutes, then copper is electrolessly deposited, such as with CIRCUPOSIT 328, available from Shipley Co., and finally copper is electrolytically plated, such as with CIRCUPOSIT 1100, available from Shipley Co.

Any direct plating methods are also suitable for use with the coated substrates of the present invention. Suitable direct plating methods include, but are not limited to CRIMSON and GRAPHITE 2000, both available from Shipley Co.

The compositions of the present invention are useful for all applications requiring definable electronic coatings. Such applications include, but are not limited to: as dielectrics in sequential build applications, as flexible overcoats for flexible circuits, as encapsulants, that is "glop-top", as soldermasks, and as underfill. The present compositions are particularly useful in applications requiring laser drilling, such as dielectrics in sequential build applications, flexible overcoats for flexible circuits and soldermasks. Laser drilling provides for more intricate geometries in electronic circuits as compared to screen printing.

Compositions of the invention are useful as dielectric innerlayers for multilayer printed circuit boards that are produced by a sequential layering process as described above and in U.S. Pat. No. 4,902,610. For example, a composition of the invention can be coated over a first circuit layer and then the coating layer cured and laser drilled as described above to provide openings that define interconnections, and then one or more other board layers sequentially formed over the drilled composition layer to form a circuit board having two or more layers of circuitry. The first circuit layer will be in electrical connection with other circuit layer(s) of the board by means of the drilled openings of the coating layer. A typical application of a dielectric innerlayer would comprise application of a two mil layer of a composition of the invention over a pre-cleaned circuitry substrate having 6-mil wide conductors; and formation of 3-mil diameter via apertures in the coating layer by means of laser ablation as discussed above. The via apertures will be located at predetermined sites within the width of the underlying conductors. The vias can then be plated with electroless copper at the same time as the second layer of circuitry conductors are plated.

The compositions of the present invention are also suitable for use as a soldermask, and will exhibit solder resistance and adhere well to copper circuitry. For example, compositions of the invention may withstand 550° F. (280–290° C.) solder flotation tests for 10 to 30 seconds without any blistering or other visible degradation of the thermally cured coating layer.

A crosslinked coating layer of a composition of the invention has the property of substantial flexibility. A more flexible crosslinked coating layer is highly advantageous because, for example, less care is required to prevent cracking or other degradation of the layer during subsequent processing steps. Cured coating layers of the compositions of the invention typically withstand 180° C. bend tests without cracking or any other degradation of the cured coating layer. Elongation testing of cured coating layers of the compositions may provide values of 5 percent and greater elongation without any detection of degradation of the coating layer. As is known to those in the art, the term "elongation value" is the length of a sample stretches before breaking, expressed as a percentage of the sample length prior to stretching. For example, a one centimeter long sample which breaks after stretching to a 1.10 centimeter length would be said to have a 10 percent elongation value.

Solid polymeric dielectric material, that is polymeric material containing no solvent, may be coated onto a substrate as a polymer melt. In such a process, a melt of the polymeric dielectric material is prepared and then applied onto the substrate to be coated. The melt of the polymeric dielectric material may be prepared, and then the substrate coated, by any conventional means, such as extrusion.

When a solid polymeric dielectric material is to be applied as a melt, such material may be applied as is, that is, without the need for a reactive diluent. It will be appreciated by those skilled in the art that a reactive diluent may be added to the melt prior to, or during, the coating of the substrate with the melt. Such reactive diluent allows for adjustment of the viscosity of the polymer melt and/or provides a crosslinked coating.

Any solid polymeric material having a low dielectric constant that can be prepared as a melt may be useful in the process of the present invention. Such solid polymeric material includes, but is not limited to: polyimide homopolymers and copolymers, poly(meth)acrylate homopolymers and copolymers and combinations thereof By way of the present invention, dielectric layers having a thickness in the range of 0.3 to 5.0 mil thick may be obtained. Preferably, the resultant dielectric layer has a thickness in the range of 1 to 3 mil thick, and more preferably 1.8 to 2.2 mil thick.

The following examples are presented to illustrate further various aspects of the present invention, but are not intended to limit the scope of the invention in any aspect. All reagents were of good commercial grade and were used without further purification.

EXAMPLE 1

A low VOC dielectric composition was prepared by combining 23.7% glycidyl butane ether (ARALDITE™RD-1, Ciba-Geigy), as a first reactive diluent, 23.7% diglycidyl butane ether (ARALDITE™RD-2, Ciba-Geigy), as a second reactive diluent, 27.8% polybutadiene rubber oligomer (POLY BD 605, Elf Atochem), as a low dielectric constant material, and 14% cresol-novolak resin having meta- to para-substitution ratio of 55:45 and average molecular weight of 5000, as a first crosslinker, using a high speed mixer. After all the components had dissolved in the reactive diluents, 6.6% melamine resin (CYMELM™303, Cytec), as a second crosslinker, 0.1% silicon wetting agent (SILWET™, Dow Chemical Co.) and 0.6% acrylate antifoam/leveling agent (MODAFLOW™, Monsanto) were added and the components combined using a high speed mixer. After 2 hours of mixing, 2.4% fumed silica, as thixotropic agent, was slowly added in order to ensure proper dispersion. After 5 hours of mixing, 1.1% blocked dodecyl sulfonic acid (NACURE™ 5225, King Industries), as thermal acid generator, was added and the mixture blended for an additional 30 minutes.

EXAMPLE 2

The procedure of Example 1 was followed, except the cresol-novolak resin crosslinker was replaced with a cresol-novolak resin having an ortho-ethyl- to meta-methyl- to para-methyl-substitution ratio of 10:50:40,

EXAMPLE 3

The procedure of Example 1 was followed except the cresol-novolak resin crosslinker was replaced with a bis-A epoxy oligomer having an epoxy equivalent weight of 475 and a softening point of 70–80° C. (DER 661, available from Dow).

EXAMPLE 4

The procedure of Example 1 was followed except the cresol-novolak resin crosslinker was replaced with an epoxy-novolak having a viscosity of 800 cps at 110° C. (DEN 444, available from Dow).

EXAMPLE 5

The procedure of Example 1 was followed except that melamine resin was replaced with a melamine having reduced methoxy substitution (RESIMENE 741, Monsanto).

EXAMPLE 6

The procedure of Example 1 was followed except that the melamine resin was replaced with a urea (BEETLE 80, available from Cytec).

EXAMPLE 7

The procedure of Example 1 was followed except the melamine resin was replaced with a glycocil (CYMEL 1170, available from Cytec).

EXAMPLE 8

The procedure of Example 1 was followed except that the blocked dodecyl sulfonic acid was replaced with dinonyl naphthalene sulfonic acid (NACURE 1419, available from King Industries).

EXAMPLE 9

The procedure of Example 1 was followed except that both the first and second reactive diluents were replaced with cresol glycidyl ether.

EXAMPLES 10–15

The procedure of Example 1 was followed except that the amounts of the components were varied, as shown in the table. All amounts are percent by weight.

| Example: | 10 | 11 | 12 | 13 | 14 | 15 |
|---|---|---|---|---|---|---|
| Reactive Diluent 1 | 22.1 | 11.1 | 33.2 | 25.7 | 22.0 | 24.8 |
| Reactive Diluent 2 | 22.1 | 33.2 | 11.1 | 25.7 | 22.0 | 24.8 |
| Polybutadiene | 29.5 | 29.5 | 29.5 | 25.7 | 32.5 | 24.2 |
| Novolak resin | 14.8 | 14.8 | 14.8 | 12.9 | 14.0 | 12.6 |
| Melamine resin | 7.0 | 7.0 | 7.0 | 6.1 | 6.7 | 6.1 |

-continued

| Example: | 10 | 11 | 12 | 13 | 14 | 15 |
|---|---|---|---|---|---|---|
| Thermal acid generator | 1.2 | 1.2 | 1.2 | 1.0 | 0.7 | 2.0 |
| Fumed silica | 26 | 2.6 | 2.6 | 2.2 | 1.6 | 4.3 |
| Wetting agent | 0.1 | 0.1 | 0.1 | 0.1 | 0.1 | 0.1 |
| Antifoam agent | 0.7 | 0.7 | 0.7 | 0.6 | 0.4 | 1.1 |

EXAMPLE 16

Each of the samples prepared according to Examples 1–15 was coated separately on a pre-formed circuit board. Each resulting coating was from 0.3 to 5.0 mil thick. The coated substrates were then baked in two stages, first at 90° C. for 30 minutes, then at 155° C. for 60 minutes. After baking, the coated substrates were cooled and subjected to pre-programmed laser drilling.

The coated substrates were then prepared for electroless plating by first adhesion promoting the substrates using a solvent (Shipley 3032, available from the Shipley Co.) at 165° F. for 3 minutes and Shipley 3308 etch (available from the Shipley Co.) at 165° F. for 5 minutes, followed by immersion in a neutralizer (NEUTRALIZER 3314, available from the Shipley Co.) for 5 minutes, and finally by rinsing the substrates with water for 2 minutes. The substrates were then dipped into a cleaner/conditioner (Cleaner/Conditioner 3320, available from the Shipley Co.) at 120° F. for 3 minutes, followed by rinsing with water for 2 minutes.

Next, the coated substrates were then dipped in Shipley 748 etch (available from the Shipley Co.) at room temperature for 1 minute followed by rinsing with water for 2 minutes. After rinsing, the coated substrates were placed in CATAPOSIT 404 (available from the Shipley Co.) at room temperature for 30 seconds. Following this treatment, the coated substrates were placed in CATAPOSIT 44 at 115° F. for 4 minutes, followed by water rinsing for 2 minutes. The substrates were then placed in ELECTROLESS 3350 (available from the Shipley CO.) at 115° F. for 7 minutes, rinsed with water for 2 minutes, dried and baked at 90° C. for 30 minutes and then baked at 120° C. for 30 minutes. Finally, the coated substrates were electroplated using ELECTROPOSIT 1100 (available from the Shipley Co.) at 20 asf for 90 minutes at room temperature.

In each case, copper plating up to 9 pounds per linear inch bond strength was achieved.

EXAMPLE 17

Sequentially built circuit boards were prepared by printing and etching the circuit boards prepared according to Example 16 to provide traces and vias. The steps of Example 9 were then repeated to provide a second dielectric layer. These steps were repeated until the desired number of layers were achieved.

What is claimed is:

1. A definable composition consisting essentially of:
   a) from 1 to 99% by weight of at least one low dielectric constant, crosslinkable material selected from the group consisting of polybutadiene, functionalized polybutadiene, polyphenyleneoxides, functionalized polyphenyleneoxides, polyfluorocarbons, functionalized polyfluorocarbons and mixtures thereof;
   b) from 1 to 99% by weight of at least one reactive diluent; and
   c) a catalyst selected from the group consisting of thermal acid generators, photoacid generators, thermal base generators, photobase generators, and mixtures thereof;
   wherein the composition comprises up to 2% of organic solvent.

2. The composition of claim 1 wherein the catalyst is selected from the group consisting of thermal acid generators, photoacid generators and mixtures thereof.

3. The composition of claim 1 wherein the amount of the catalyst is in the range of 0.1 to 25% by weight, based on the weight of the composition.

4. The composition of claim 1 further comprising a crosslinking agent.

5. The composition of claim 4 wherein the amount of the crosslinking agent is in the range of 10 to 80% by weight, based on the weight of the composition.

6. The composition of claim 4 wherein the crosslinking agent is selected from the group comprising phenolic resins, amine containing compounds, epoxy containing materials, compounds containing at least two vinyl ether groups, allyl substituted aromatic compounds, and combinations thereof.

7. The composition of claim 6 wherein the crosslinking agent is selected from the group comprising phenolic resins and amine containing compounds.

8. The composition of claim 1 wherein the reactive diluent is selected from the group comprising (meth)acrylic acid monomers or polymers, alkyl(meth)acrylate monomers or polymers, (meth)acrylamide monomers and polymers, low molecular weight acetals, vinyl ethers, poly(vinyl ethers), polyamides, polyetherimides, urethanes and epoxies.

9. A substrate coated with the dielectric composition of claim 1.

10. The substrate of claim 9 wherein the substrate is a printed circuit board.

11. A definable composition consisting essentially of:
   a) from 20 to 80% by weight of at least one low dielectric constant, crosslinkable material selected from the group consisting of polybutadiene, functionalized polybutadiene, polyphenyleneoxides, functionalized polyphenyleneoxides, polyfluorocarbons, functionalized polyfluorocarbons and mixtures thereof;
   b) from 10 to 80% by weight of at least one crosslinking agent;
   c) from 0.1 to 25% by weight of at least one catalyst selected from the group consisting of thermal acid generators, photoacid generators, thermal base generators, photobase generators, and mixtures thereof; and
   d) from 5 to 60% by weight of a reactive diluent;
   wherein the composition comprises up to 2% of organic solvent.

12. The composition of claim 11 wherein the crosslinking agent is selected from the group comprising phenolic resins, amine containing compounds, epoxy containing materials, compounds containing at least two vinyl ether groups, allyl substituted aromatic compounds, and combinations thereof.

13. The composition of claim 12 wherein the crosslinking agent is selected from the group comprising phenolic resins and amine containing compounds.

14. The composition of claim 11 wherein the reactive diluent is selected from the group comprising (meth)acrylic acid monomers or polymers, alkyl(meth)acrylate monomers or polymers, (meth)acrylamide monomers and polymers, low molecular weight acetals, vinyl ethers, poly(vinyl ethers), polyamides, polyetherimides, urethanes and epoxies.

15. A substrate coated with the dielectric composition of claim 11.

* * * * *